US006829261B2

(12) United States Patent
Kleinschmidt

(10) Patent No.: US 6,829,261 B2
(45) Date of Patent: Dec. 7, 2004

(54) METHOD FOR THE STABILIZATION OF THE RADIATION OUTPUT OF A GAS DISCHARGE-COUPLED RADIATION SOURCE IN PULSED OPERATION

(75) Inventor: Juergen Kleinschmidt, Weissenfels (DE)

(73) Assignee: Xtreme Technologies GmbH, Jena (DE)

( * ) Notice: Subject to any disclaimer, the term of this patent is extended or adjusted under 35 U.S.C. 154(b) by 48 days.

(21) Appl. No.: 10/425,301

(22) Filed: Apr. 29, 2003

(65) Prior Publication Data

US 2003/0201737 A1 Oct. 30, 2003

(30) Foreign Application Priority Data

Apr. 30, 2002 (DE) .......................... 102 19 805

(51) Int. Cl.[7] .................................................. H01S 3/10
(52) U.S. Cl. ................. 372/25; 372/29.015; 372/29.02; 372/29.021
(58) Field of Search .............................. 372/25, 29.02, 372/29.021, 30, 29.014, 29.015, 57

(56) References Cited

U.S. PATENT DOCUMENTS 6,005,879 A  12/1999  Sandstrom et al. ........... 372/25

2003/0058429 A1 * 3/2003 Schriever .................... 355/133

OTHER PUBLICATIONS

Proc. SPIE vol. 3997 (2000) 126, V. Banine et al.

* cited by examiner

Primary Examiner—Tuyet Thi Vo
(74) Attorney, Agent, or Firm—Reed Smith LLP

(57) ABSTRACT

A method is disclosed for stabilization of the radiation output of a gas discharge-coupled radiation source in pulsed operation, particularly of an EUV source based on a gas discharge. The object of the disclosed invention is to find a novel possibility for stabilizing the radiation output of a gas discharge-coupled radiation source in pulsed operation which allows the pulse energy to be regulated on the basis of pulse energy fluctuations of the radiation emission detected through measurements without requiring regular calibration measurements of the E(U) curve in the stationary operating regime with continuous pulse sequences. According to the invention, this object is met in that continuous measurements of the pulse energy and at least one influencing variable are carried out for every radiation pulse of the EUV source, time averages of the pulse energy and influencing variable are formed, and the deviation of the actual measurement values from the average values are determined, so that a proportionality factor $dE/dU$ determined by statistical analysis is available for PI regulation in the operating point of the averaged pulse energy.

16 Claims, 3 Drawing Sheets

METHOD FOR THE STABILIZATION OF THE RADIATION OUTPUT OF A GAS DISCHARGE-COUPLED RADIATION SOURCE IN PULSED OPERATION

CROSS-REFERENCE TO RELATED APPLICATIONS

This application claims priority of German Application No. 102 19 805.5, filed Apr. 30, 2002, the complete disclosure of which is hereby incorporated by reference.

BACKGROUND OF THE INVENTION a) Field of the Invention

The invention is directed to a method for the stabilization of the radiation output of a gas discharge-coupled radiation source in pulsed operation, particularly of an EUV source based on a gas discharge. It is preferably applied in semiconductor chip fabrication for maintaining dose stability in EUV extreme ultraviolet lithography.

b) Description of the Related Art

EUV radiation sources seem to be the most promising development trend for the next generation in lithography machines for semiconductor chip fabrication. Structure widths of less than 50 nm are to be achieved in this connection. It is hoped that the corresponding resolution will be achieved with EUV radiation (around 13.5 nm) and moderate numerical apertures of the applicable optics of 0.2 . . . 0.3.

The EUW radiation source itself represents the component group with the most limitations and resulting sources of error. It is comprising the EUV radiation output, the predetermined solid angle in which the radiation is detectable, the magnitude of the emitting plasma, the pulse repetition frequency, pulse-to-pulse fluctuations (output fluctuations and spatial fluctuations of EUV emission), the life of the discharge unit, and the life of the optical components.

A complete lithography system is judged principally on the basis of throughput (i.e., wafers processed per hour), image quality and cost of ownership (CoO).

The in-band radiation output arriving at the wafer location and the sensitivity of the photo-sensitive layer (resist) in the desired EUV range determine the throughput of the system, while the image quality is determined by the dose stability (dose accuracy). According to V. Banine et al. (Proc. SPIE Vol. 3997 (2000) 126), this dose accuracy is essentially determined by the following three contributing factors:

a) pulse quantization b) pulse-to-pulse stability c) spatial stability of the emitting plasma.

Pulse quantization is scanner-specific. The quantity of beam pulses that can fall into the slit of the scanner can vary in that the first and/or last pulse does not strike the slit. This results in a dose error of $D_a$:

$$D_a \approx 2/N^2,$$

where N is the number of pulses falling into the slit and is composed as follows:

N=slit width * repetition rate/scanning speed.

Contributors b) and c) are source-specific. Contributor b) is given by the pulse energy fluctuations of the emitting plasma.

$$D_b \approx 3\sigma(\text{energy})/N^{1/2}.$$

For example, $3\sigma$ (energy) is the maximum amplitude of the energy fluctuations.

Further, a spatial fluctuation of the plasma results from the statistical character of the gas discharge. This likewise causes an error contribution to the radiation dose effective at the target location (e.g., wafer) in a manner predetermined by the optics of the scanner:

$$D_c \approx 6*3\sigma(\text{spatial})/N^{1/2}.$$

The substantial disadvantage of known EUV radiation sources consists in that the contributions of energy fluctuations in EUV emissions resulting from different causes is not detected and evaluated through measurement and the EUV sources are therefore unregulated at least insofar as the constancy of the pulse energy is concerned.

OBJECT AND SUMMARY OF THE INVENTION

It is the primary object of the invention to find a new possibility for stabilizing the radiation output of a gas discharge-coupled radiation source in pulsed operation, particularly an EUV radiation source, which allows the pulse energy to be regulated on the basis of pulse energy fluctuations of the radiation emission detected through measurements without requiring regular calibration measurements of the pulse energy depending on the charging voltage (a recalibration of the so-called E(U) curve).

According to the invention, in a method for the stabilization of the radiation output of a gas discharge-coupled radiation source in pulsed operation, particularly an EUV source, in which a constant pulse energy is to be radiated within a sequence of many consecutive radiation pulses, the above-stated object is met by the following steps:

measurement of the pulse energy of every radiation pulse of the EUV source, measurement of at least one influencing variable for every radiation pulse, formation of time averages of the pulse energy and influencing variable, calculation of the deviation of the actual measurement values from the average values of the pulse energy and influencing variable, determination of the ratio of pulse energy and influencing variable at least for an operating point in which the pulse energy is to be kept constant, wherein the ratio is assumed to be linear based on the small magnitude of the fluctuations compared to the averages and is determined in the form of a proportionality factor of the functional dependence, determination of scaled correlation coefficients of the measured influencing variables in order to determine the degree of statistical dependence of the influencing variables upon the pulse energy, regulation of the pulse energy by means of PI regulation based on the actual proportionality factor (a) corresponding to at least one influencing variable with the greatest correlation coefficient.

The charging voltage at the high-voltage source for the gas discharge is advantageously measured as primary influencing variable. Other influencing variables which can be measured and evaluated in a supplementary manner or in combination with one another are the breakdown voltage of the gas discharge measured, e.g., at discharge capacitors which are arranged for the buildup of a reproducible discharge voltage between high-voltage source and discharge electrodes (so-called peaking capacitors), the position of the emitting plasma (measured by means of a spatially resolving detector), or the pressure of the working gas measured in the discharge chamber of the radiation source.

The pulse energy, as regulating variable, is advisably measured by means of an energy detector in the immediate vicinity of the emitting plasma. This main energy detector is preferably arranged opposite to an illumination beam path directed to a target object. The pulse energy can be measured at the target object location (e.g., a wafer in an exposing device for semiconductor lithography) as another (supplemental) influencing quantity.

Due to the degradation of mirror surfaces (e.g., of the collector optics for bundling the emitted EUV beam) and the like aging processes of the main energy detector caused by radiation, a reference pulse energy is advantageously measured at greater intervals in a low-light reference beam path in addition to the pulse energy of every individual beam pulse in order to compensate for degradation phenomena.

The proportionality factors in a regulation that takes into account the dependency of pulse energy on several of the influencing variables mentioned above are advantageously calculated by statistical evaluation of the measured pulse energy and of the selected influencing variables $(X, Y, \ldots)$, wherein the selected influencing variables are included according to the general equation for different (two, in this case) interference variables $(X, Y)$ of a regulating process $$E = a\,X + b\,Y,$$

where $$a = (\langle EX \rangle - b \langle XY \rangle)/\langle X^2 \rangle$$

and $$b = (\langle EY \rangle - a \langle XY \rangle)/\langle y^2 \rangle$$

and the equations can be expanded in a corresponding manner when required.

The proportionality factors a and b are preferably calculated by applying the least squares method for a direct dependence between the pulse energy and the influencing variables.

In order to determine how pulse energy and influencing variables (the latter are seen in this case as interference variables in a regulating process) are correlated with one another, the correlation coefficients are advisably calculated (for two different interference quantities X and Y) as $$K_1(E,X) = \langle XE \rangle / (\langle X^2 \rangle \langle E^2 \rangle)^{1/2}$$

$$K_2(E,Y) = \langle YE \rangle / (\langle Y^2 \rangle \langle E^2 \rangle)^{1/2}$$

$$K_3(X,Y) = \langle XY \rangle / (\langle X^2 \rangle \langle Y^2 \rangle)^{1/2}.$$

These correlation coefficients can then also be advantageously used for in-situ analysis of changes in the EUV radiation source itself and in the illumination beam path to the target object (e.g., wafer) and for in-situ analysis of errors and interference in the radiation source in its entirety For regulation of fast changes in the pulse energy, it is advisable to carry out the control of the gas discharge-coupled radiation source by changing the charging voltage at the high-voltage source (power supply). In this connection, it is advantageous for a fast regulation of pulse energy to use a PI (proportional-integral) regulation in the stationary operating regime, i.e., within a sequence of beam pulses in which constant discharge conditions can be assumed (e.g., burst of several hundred pulses) and to calculate a proportionality factor required for this from a statistical analysis of deviations of the regulating quantity and influencing variable(s) from their averages.

In slowly changing processes, the regulation of another input quantity, e.g., pressure p in the discharge chamber, would also be possible.

For the regulation of comparatively slow changes (>1 s) of the pulse energy, it can also be advantageous to vary the pressure of the working gas in the discharge chamber. A pressure regulation is possible by way of the Xe throughput or He throughput with time constant 0.5 . . . 1 s and, therefore, a pressure regulation for suitable determination of the operating point is reasonable.

The basic idea of the invention is based on the understanding that the fluctuations of pulse energy of gas discharge-coupled radiation sources in pulsed operation which can not be tolerated particularly in EUV radiation sources for semiconductor lithography are brought about by a variety of influencing variables (interference variables) without their relationship to the regulating variable pulse energy or to one another being suitably taken into account.

In contrast to the regulation of radiation energy by way of the rise in the function of the pulse energy depending upon the charging voltage, which is known from excimer lasers, the invention proceeds from a statistical analysis of the deviations of the influencing variables (interference variables) from their averages by way of a large number of radiation pulses with continuous measurement and regulation. In this connection, linear dependencies can be specified due to the small quantity of the deviations compared to the associated averages. Accordingly, a simple evaluation of the correlation of the influencing variables can be used for proportional regulation of the pulse energy.

With the method according to the invention, it is possible to detect pulse energy fluctuations in the radiation emitted by a gas discharge-coupled radiation source in pulsed operation based on different influencing variables that are detected by measuring techniques and to select the essential influencing variables and suitable control variables for regulation through statistical correlation so as to achieve a sufficient pulse-to-pulse stability of the radiation, particularly for EUV radiation sources, and a high dose stability at the target point (wafer).

The invention will be described more fully in the following with reference to embodiment examples.

DESCRIPTION OF THE PREFERRED EMBODIMENTS

The following description relates to energy regulation for gas discharge-coupled EUV radiation sources with reference to the high accuracy requirements for the dose stability in semiconductor lithography without limiting generality.

Present experience shows that the standard deviations of the pulse energy from the average (σ values), the position of the center or gravity of the luminous region (sometimes also described as Poynting stability) and the position stability of the plasma in discharge-coupled EUV radiation sources (particularly z-pinch arrangements) far exceed the corresponding σ-values in excimer lasers in the DUV range (deep ultraviolet range).

The demands of the chip manufacturer with respect to dose stability (at the wafer site) require a pulse-to-pulse energy regulation. Pulse energy regulation for pulse repetition frequencies in the kHz range is possible only by means of a fast high-voltage regulation of the charging voltage. However, the pulse energy of EUV radiation at the location of the wafer is influenced by many influencing variables (from the point of view of regulation: interference variables, such as fluctuations in the breakdown voltage of the working gas, fluctuations in the location of the emitting region and of the plasma itself, vibrations in the optical system, and so on). In this connection, a structure of occurring parameters and measurement values are shown for an EUV radiation source used in semiconductor lithography.

The radiation emission is generated for the use of this invention based on a high-voltage gas discharge in a discharge chamber filled with a working gas (preferably xenon, helium). As a result of the high discharge current through a field-induced implosion of the discharge plasma, a z-pinch plasma is brought about which, as a narrowly defined, concentrated (focused) region, emits the desired EUV radiation.

Figure 1:
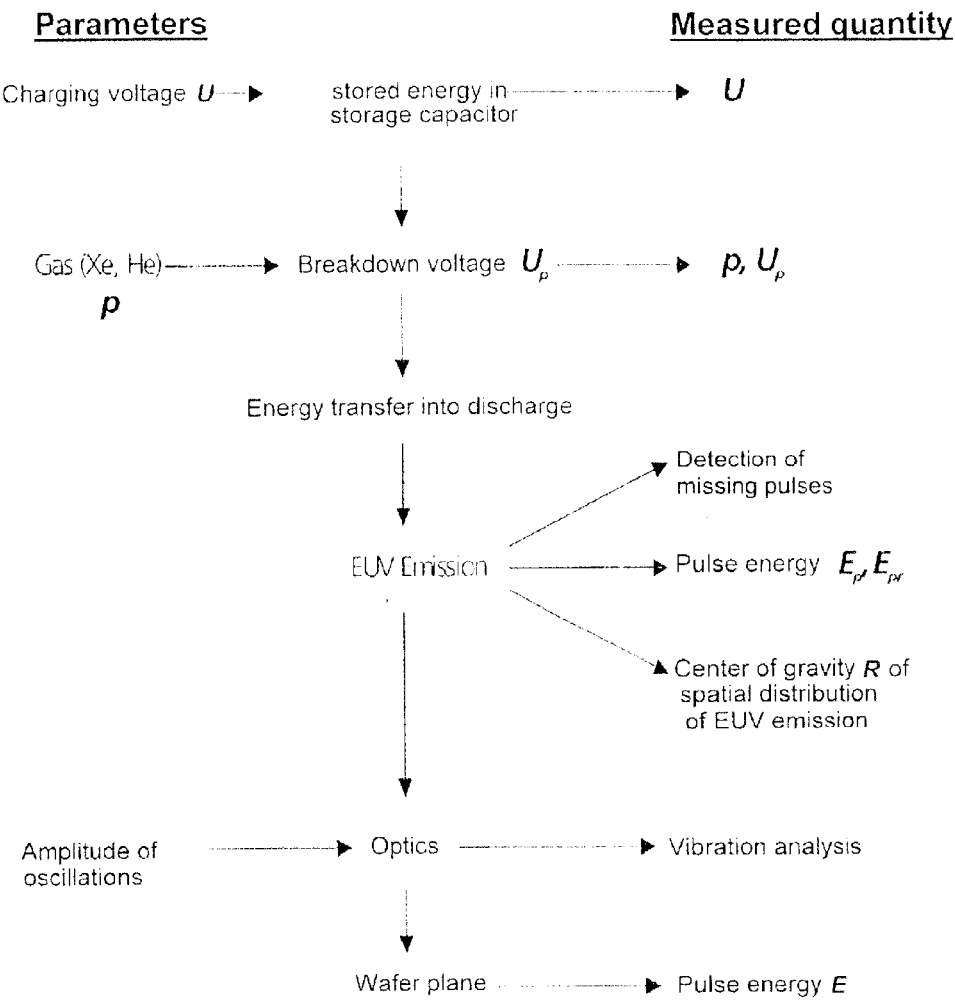
FIG. 1 shows a measured quantity structure for regulating pulse energy in an EUV radiation source integrated in a photolithography scanner.

Shown in the center of the flowchart in FIG. 1 is the EUV radiation emission (at the location of the focused plasma) which is influenced by many factors (influencing variables, interference variables) and leads to different energy yields per pulse of the emitted radiation (pulse energy E) and, accordingly, to a fluctuating radiation dose at the location of the target object (wafer). Influencing variables representing regulation variables for the radiation dose are the charging voltage U and the gas pressure p of the working gas, both of which mutually influence the energy conversion in the gas discharge in the EUV emission.

Particular measured quantities relevant to dose stability in semiconductor lithography are shown in the flowchart of FIG. 1 at right, next to the EUV emission. The pulse energy $E_p$ which is measured directly in the immediate vicinity of the plasma—usually just inside the discharge chamber—has special significance. Because of the expected degradation effects in the mirrors and energy detectors, a reference value $E_{pr}$ of the pulse energy is recorded in addition from time to time (e.g., after several thousand to one million pulses) in a low-light channel and is used for compensation purposes. Further, individual discharge misfires are also detected (low light detection) as error pulses that are used for a special handling of the measured values recorded for this purpose.

The center of gravity R of the spatial distribution of the EUV emission which changes essentially due to spatial fluctuations in the position of the plasma has a further substantial influence on the pulse energy E arriving in the wafer plane. A fluctuating position of the center of gravity R changes the entrance angle of the EUV radiation in the downstream optical systems (collector optics and optics and scanning slits used in photolithography scanners) and, accordingly, compulsorily leads to an unwanted fluctuation of the dose stability at the wafer location.

Some of these interfering influences are statistically independent from the charging voltage U (e.g., the vibrations of the optics) and others can depend indirectly on the charging voltage U. An in-situ analysis of these relationships is not only important for regulation, but is also meaningful and useful for the error analysis of the system.

Therefore, according to the present invention, sensors for voltages and pulse energy and position-sensitive radiation sensors whose output signals are detected permanently and used for determining statistical relationships by means of an in-situ correlation analysis between the signals are arranged at determined locations within the EUV radiation source and at the location of the target object (e.g., wafer plane). The regulation, per se, is carried out by an approach or arrangement that is made possible by relating the fluctuations of regulation parameters and influencing variables (interference variables) to their averages over time (in the so-called stationary regime, i.e., within a sequence of consecutive beam pulses). The deviations from the respective averages are so small that a linear dependency can be adopted and used for regulation.

It will be shown in the following that an analysis of this kind also supplies dE/dU values for the energy regulation by way of the charging voltage U, so that uneconomical determination of dE/dU values based on an E(U) characteristic line which is specific to the radiation source and which is determined by calibrating measurements (including regular recalibration) for the PI regulation usually used with excimer lasers (U.S. Pat. No. 6,005,879) can be dispensed with.

The column on the left in FIG. 1 shows input quantities which are statistically independent from one another and which influence the output values, the pulse energy E at the location of the wafer (wafer plane). The column on the right contains the measurable influencing variables or interference variables:

charging voltage U (voltage measurement at the voltage supply (main power supply)

gas pressure p (e.g., working gas Xe/He)

breakdown voltage $U_p$ (measurement at the discharge capacitors, so-called peaking capacitors)

EUV pulse energy $E_p$ (not spatially resolved),

EUV reference pulse energy $E_{pr}$ (not spatially resolved) measured from time to time in a low-light reference channel by means of compensating for degradation of mirrors and energy detector (measurement $E_p$), spatial center of gravity R of the EUV emission (with position-sensitive sensor)

vibration analysis of the entire arrangement taking into account the vibration amplitudes in the frequency range of pulse repetition frequency per average quantity of pulses striking the slit of the scanner pulse energy E at the location of the wafer (wafer plane).

As was already mentioned above, a fast energy regulation can only be carried out by regulating the charging voltage U.

For exciter lasers, it is known that fast pulse regulation means controlling the pulse energy before every laser shot by varying the charging voltage U and the algorithm used for this purpose allows calculation of the charging voltage U for the pulse energy of the nth light pulse according to $$U_n = U_{n-1} - (AE_{n-1} + BD_{n-1})/(dE/dU), \quad (1)$$

where $E_{n-1} = E_{n-1} - E_S$ and $D_{n-1} = \Sigma_i (E_i - E_S)$ (i=1 ... n−1)

$E_S$ is the set energy (corresponding to a desired target value of the pulse energy) and A, B are factors to be optimized by trial and error, where dE/dU is usually determined by measurement series of the functional dependence E=f (U). The rise dE/dU is obtained from the total E(U) curve (E—laser pulse energy, U—charging voltage). Knowledge of this curve is important for characterizing the status of the laser.

The preceding can also be applied to an EUV radiation source based on a gas discharge. However, knowledge of the entire E(U) curve is not used for fast energy regulation because the invention works with an adapted regulation factor, so that, due to the choice of a target value of the pulse energy, of the set energy $E_S$, as operating point of the radiation source, the rise dE/dU of the E(U) curve is necessary only in this operating point.

The operating point is determined by the energy value of the set energy $E_S$ to be stabilized (e.g., 10 mJ) and is equated for the regulating procedure with an energy average <E> of the pulse energy that is continuously updated by means of constant measurements. The associated voltage average is <U>. Equation (1) applies only in cases where the pulse energy <E> averaged over many radiation pulses is equal to the set value $E_S$ at constant operating voltage (in the operating point). This applies (at least over a long period of time) for the continuous operation of a pulsed EUV radiation source.

In cw operation, averaging would be carried out over any number of pulses, but in conventional lithography operation, the average values <E>, <U> are typically understood as averaging over a determined quantity N of beam pulses. This could be the quantity N of pulses per "slit" (scanning slit of the scanner). In this case, <E> is considered a moving average (<E>=$\Sigma_i E_i$/N) over N pulses. On the other hand, the averaging can also be carried out over the total number of pulses in a so-called burst (pulse train of several hundred pulses).

Figure 2:
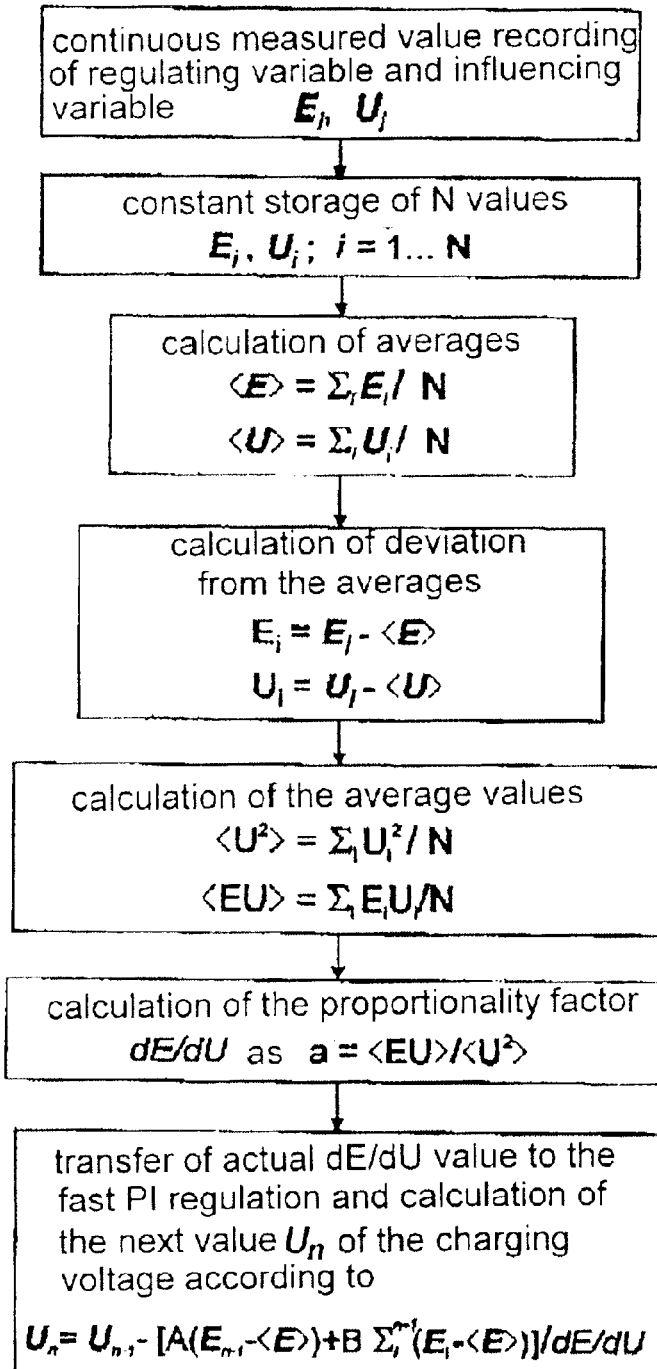
FIG. 2 shows a flowchart of the method for regulating charging voltage as a function of the pulse energy (in the wafer plane)

In case E is directly dependent only on U, the procedure according to FIG. 2 is arranged as follows.

Since the fluctuations around the average are smaller toward the mean value itself, a linear dependence can be assumed:

$$(E_i - <E>) = a(U_i - <U>) \quad (2)$$

This can be written as:

$$E_i = a\, U_i, \quad (3)$$

where $E_i = (E_i - <E>)$ and $U_i = (U_i - <U>)$

The proportionality factor a (corresponds to the rise dE/dU) can be determined by the least squares method:

$$dE/dU = a = <EU>/<U^2> \quad (4)$$

Since all pulse energy values $E_i$ and charging voltage values and $U_i$ and deviations of these values from the average values $E_i$ and $U_i$ (hereinafter also measured values) are continuously stored in data files of the control computer, a can be continuously calculated by averaging <E U> and <$U^2$> and accordingly dE/dU can be continuously updated in the required scope (operating point).

Another advantage of this procedure in determining the proportionality factor a for regulating the pulse-to-pulse stability of the pulse energy E consists in that the scaled correlation coefficient $$K(E,U) = <E \cdot U> \cdot (<U^2><E^2>)^{1/2} \quad (5)$$

can be calculated directly from the measured values $E_i$ and $U_i$.

This indicates how firmly the pulse energy E and charging voltage U are correlated. This is especially important when the radiated pulse energy E is influenced by several quantities (interference values) (see FIG. 1).

A second example illustrates a generalized case in which the radiated energy E is influenced by two interference variables X and Y ($E_i$, $X_i$, $Y_i$ should also represent the deviations from the respective averages in a manner analogous to that agreed upon in equation (3)).

$$E = aX + bY \quad (6)$$

The factors a and b can be calculated using the least squares method:

$$<(E - aX - bY)^2> \rightarrow \text{minimum}$$

to arrive at $$a = (<EX> - b<XY>)/<X^2>,$$

$$b = (<EY> - a<XY>)/<Y^2>, \quad (7)$$

In the present case also, the scaled correlation coefficients K(E, X), K(E, Y), K(X, Y) are evaluated from the measured values in a simple manner analogous to equation (5).

This will now be explained according to FIG. 3 in the specific case of an EUV radiation source with the two influencing variables of pulse energy $E_p$ (in the vicinity of the plasma) and center of gravity R of the emitting region.

It can be seen from FIG. 1 that the pulse energy E in the wafer plane does not depend on the charging voltage U directly, but rather by way of the two quantities $E_p$ and R.

Therefore, analogous to equation (6), the average fluctuation of the pulse energy E in the wafer plane is given by $$E = \alpha E_p + \beta R \quad (8)$$

where $E_p = E_p - <E_p>$ and $R = R - <R>$

Figure 3:
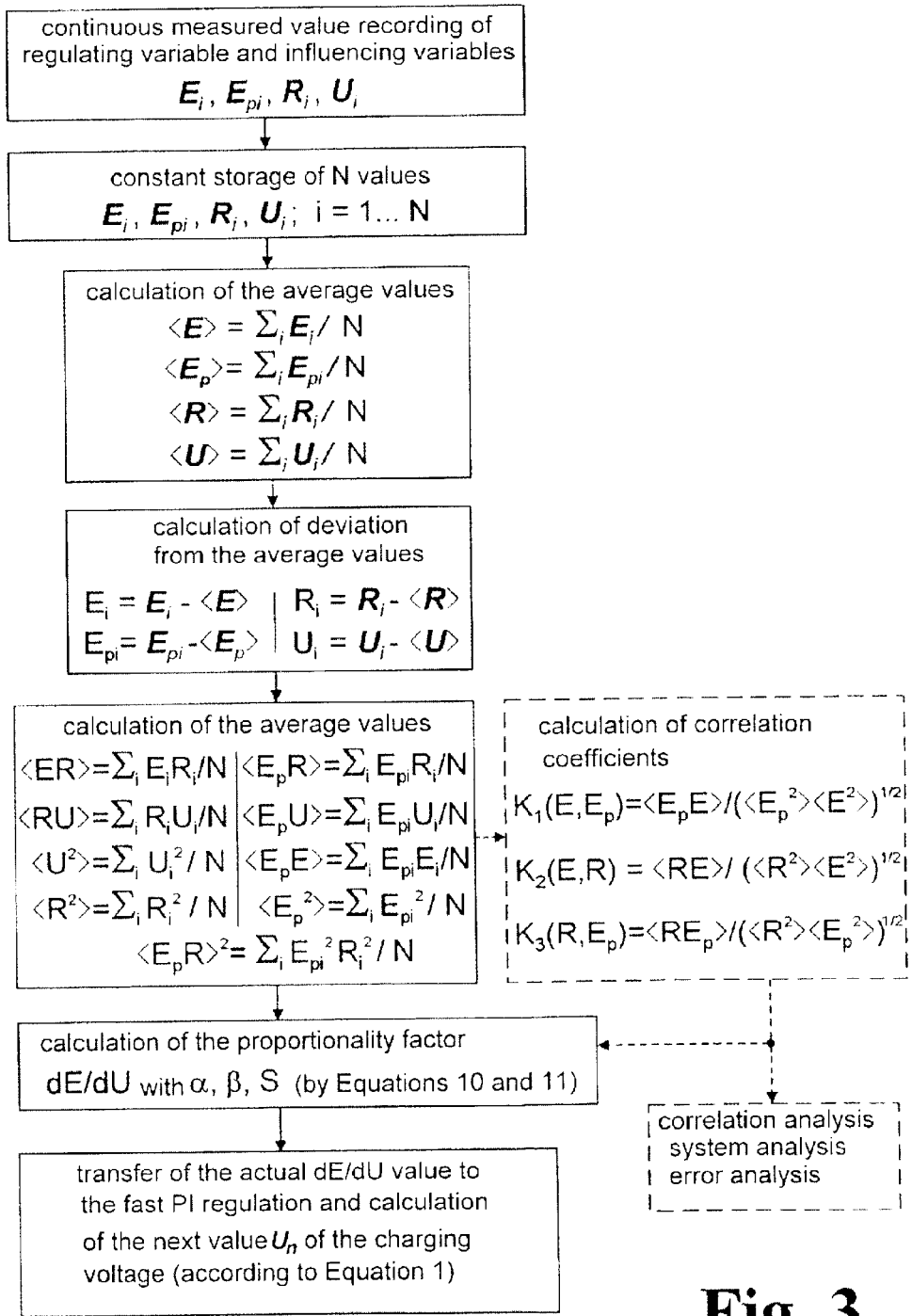
FIG. 3 shows a flowchart of the method for two direct influencing variables, pulse energy $E_p$ (in the vicinity of the plasma) and position centroid R of the EUV emission.

FIG. 3 shows the flowchart for determining dE/dU in a sequence of method steps. The sequence of steps for every set of parameters and influencing variables $E_i$, $E_{pi}$, R and $U_i$ which are recorded (measured) successively in time is run through repeatedly.

For the averaging carried out in the third step, the required quantity N of measurement values $E_i$, $E_{pi}$, $R_i$ and $U_i$ is selected in such a way that identical excitation conditions (stationary case) can be presupposed when the radiation pulses of the EUV source are triggered. This is assumed as given after a few (ten or so) pulses in gas discharge-coupled radiation sources in regular pulse sequences.

In this variant, the suggested method offers the possibility of an evaluation and control when the pulse energy E at the location of the wafer depends directly on several quantities (e.g., $E_p$ and R) and on the charging voltage U by way of these (indirectly). The goal in this case is also to determine the regulating factor dE/dU which is given by $$dE/dU = dE/dE_p \cdot dE_p/dU + dE/dR \cdot dR/dU \quad (9)$$

Analogous to equation (4) which is set up for only one influencing variable, the following is obtained by applying equations (6) and (7) with formula (8) for the corresponding measured quantity selection according to FIG. 3:

$$dE/dU = \alpha \cdot dE_p/dU + \beta \cdot dR/dU \quad (10)$$
$$= \alpha \cdot \langle E_p U \rangle / \langle U^2 \rangle + \beta \cdot \langle RU \rangle / \langle U^2 \rangle$$

where $\alpha = \langle E\,E_p \rangle / \langle E_p^2 \rangle \cdot [1-(\langle E\,R \rangle / \langle E\,E_p \rangle)(\langle R\,E_p \rangle / \langle R^2 \rangle)]/S$ $\beta = \langle E\,R \rangle / \langle R^2 \rangle [1-(\langle E\,E_p \rangle / \langle E\,R \rangle)(\langle R\,E_p \rangle / \langle E_p^2 \rangle)]/S$ $$S = 1 - \langle E_p R \rangle^2 / (\langle E_p^2 \rangle \langle R^2 \rangle), \quad (11)$$

wherein the required averages are to be determined correspondingly to the presets in the operator fields of FIG. 3 up to and including the fifth operator field (continuously updated). In the following sixth step, the proportionality factor is then calculated using the above equations (10) and (11).

In principle, the process suggested in FIG. 3 can be applied for any influencing variables when these influencing variables have been measured, stored and averaged correspondingly to steps 1 to 3, so that the deviations from the averages and the resulting average of the deviations are correspondingly made available.

The existing quantity of averages of the deviations in the fifth operator field according to FIG. 3 offers the possibility, shown in dashed lines, of selecting the influencing variables with the largest correlation used for the calculation of the proportionality factor dE/dU in the sixth operator field by means of calculating the correlation coefficient $K_i$.

Analogous to the equation (5) indicated in the first example, the correlation coefficient can be calculated as follows for the direct influencing variables in this case, pulse energy $E_p$ (in the vicinity of the plasma) and center of gravity R of the plasma:

$$K_1(E,E_p) = \langle E_p E \rangle / (\langle E_p^2 \rangle \langle E^2 \rangle)^{1/2}$$
$$K_2(E,R) = \langle ER \rangle / (\langle R^2 \rangle \langle E^2 \rangle)^{1/2}$$
$$K_3(E_p,R) = \langle E_p R \rangle / (\langle E_p^2 \rangle \langle R^2 \rangle)^{1/2}. \quad (12)$$

These correlation coefficients $K_i$ can then also be used in an advantageous manner for in-situ analysis of changes in the EUV radiation source itself and in the illumination beam path to the target object (e.g., wafer) and for in-situ analysis of errors and interference in the entire radiation source.

The additional operator fields are shown in FIG. 3 in dashed lines as a side branch of the steps to be carried out permanently shown in the vertical column of operator fields and further enable an in-situ error analysis of the EUV radiation source or of the entire illumination beam path of the lithography machine.

Although the invention has been described in the indicated examples in connection with gas discharge-coupled EUV radiation sources, it is also applicable in an equivalent manner to any radiation sources based on a gas discharge and in pulsed operation, particularly excimer lasers.

In this connection, it is understood that solutions using statistical detection of measured values which detects the fluctuations of the influencing variables in relation to the averages formed from many measurements and, based upon this, an underlying linear dependency and which accordingly enable a simple correlation analysis are clearly covered by the invention.

In particular, the invention—as selected in the examples—is not designed so as to be limited to one or two influencing variables (interference variables) in statistical analysis, but rather includes expansion to all appropriate influencing variables having a sufficiently great correlation to at least one appropriate regulating variable While the foregoing description and drawings represent the present invention, it will be obvious to those skilled in the art that various changes may be made therein without departing from the true spirit and scope of the present invention.

Reference Numbers

E pulse energy (in wafer plane)

$E_p$ pulse energy (in the vicinity of the plasma)

$E_{pr}$ reference value of the pulse energy $E_i$, $U_i$, ..., $R_i$ measured values $\langle E \rangle$, $\langle U \rangle$, ..., $\langle R \rangle$ averages of the measured values $E_i$, $U_i$, ..., $R_i$ deviations (from the averages of the measured values)

$\langle E \rangle$, $\langle U \rangle$, $\langle R \rangle$, ...

$\langle EU \rangle$, $\langle U^2 \rangle$, ... averages of the deviations

K, $K_i$ correlation coefficient

N quantity of pulses a, b, $\alpha$, $\beta$ proportionality factors dE/dU proportionality factor (of PI regulation)

A, B coefficient of PI regulation

What is claimed is:

1. A method for the stabilization of the radiation output of a gas discharge-coupled radiation source in pulsed operation, particularly of an EUV radiation source, in which a constant pulse energy is to be radiated within a sequence of many consecutive radiation pulses, comprising the following steps:

measuring the pulse energy of every radiation pulse of the EUV source;

measuring at least one influencing variable;

forming of time averages of the pulse energy and influencing variable;

calculating the deviation of the actual measurement values from the average values of the pulse energy and influencing variable;

determining the ratio of pulse energy and influencing variable at least for an operating point in which the pulse energy is to be kept constant, wherein the ratio is assumed to be linear based on the small magnitude of the fluctuations compared to the averages and is determined in the form of a proportionality factor of the functional dependence;

determining scaled correlation coefficients of the measured influencing variables in order to determine the degree of statistical dependence of the influencing variables upon the pulse energy; and regulating the pulse energy by means of PI regulation based on the actual proportionality factor (a) corresponding to at least one influencing variable with the greatest correlation coefficient.

2. The method according to claim 1, wherein the correlation coefficients (K) between regulating quantity (E) and influencing variables (U, $U_p$, R, p, $E_p$) are calculated, the latter for two different interference quantities (X, Y), according to $$K_1(E,X) = \langle XE \rangle / (\langle X^2 \rangle \langle E^2 \rangle)^{1/2}$$

$$K_2(E,Y) = \langle YE \rangle / (\langle Y^2 \rangle \langle E^2 \rangle)^{1/2}$$

$$K_3(X,Y) = \langle XY \rangle / (\langle X^2 \rangle \langle Y^2 \rangle)^{1/2}.$$

3. The method according to claim 1, wherein the correlation coefficients (K) are used for in-situ analysis of changes in the radiation source and in the illumination beam path.

4. The method according to claim 1, wherein the correlation coefficients (K) are used for in-situ error analysis of the radiation source.

5. The method according to claim 1, wherein comparatively slow changes of the pulse energy are regulated by varying the gas pressure (p) in the discharge chamber.

6. The method according to claim 1, wherein the pulse energy ($E_p$), as influencing variable, is measured by means of a main energy detector which is arranged in the vicinity of the emitting plasma outside of an illumination beam path directed to a target object.

7. The method according to claim 6, wherein a reference pulse energy ($E_{pr}$) is measured at greater intervals in a low-light reference beam path in addition to the pulse energy ($E_p$) of every pulse in order to compensate for aging The methodes in mirrors and in the main energy detector.

8. The method according to claim 1, wherein a plurality of proportionality factors (a, b) are calculated by statistical evaluation of the measured regulating quantity (E) and the influencing variables (X, Y) selected on the basis of correlation coefficients for regulation depending on a plurality of influencing variables (U, $U_p$, R, p, $E_p$), wherein the regulation is defined for two different interference variables (X, Y) according to the general equation $$E = aX + bY.$$

9. The method according to claim 8, wherein the proportionality factors (a, b) are calculated by applying the least squares method for a direct dependence between regulating quantity (E) and influencing variables (U, $U_p$, R, p, $E_p$) for any two influencing variables (X, Y) according to the general equations $$a = (\langle EX \rangle - b \langle XY \rangle) / \langle X^2 \rangle$$

and $$b = (\langle EY \rangle - a \langle XY \rangle) / \langle Y^2 \rangle.$$

10. The method according to claim 1, wherein fast changes in the pulse energy (E) are regulated by changing the charging voltage (U) at the voltage source.

11. The method according to claim 10, wherein for a fast regulation of pulse energy in a stationary operating regime, a PI regulation according to $$U_n = U_{n-1} - (A\, E_{n-1} + B\, D_{n-1}) / (dE/dU),$$

where $$E_{n-1} = E_{n-1} - \langle E \rangle$$

and $$D_{n-1} = \Sigma_i (E_i - \langle E \rangle), i = 1 \ldots n-1$$

is used and the proportionality factor dE/dU in the operating point is calculated from the statistical analysis in an updated manner by continuous calculation of deviations of the regulating quantity (E) and influencing variable (U) from their averages ($\langle U \rangle$, $\langle E \rangle$).

12. The method according to claim 1, wherein the charging voltage (U) at a high-voltage source for the gas discharge is measured as primary influencing variable.

13. The method according to claim 12, wherein the breakdown voltage ($U_p$) for every gas discharge is measured at intermediately arranged discharge capacitors as another influencing variable.

14. The method according to claim 12, wherein the position (R) of the emitting plasma is measured by a spatially resolving detector as another influencing variable.

15. The method according to claim 12, wherein the pressure (p) of the working gas in the discharge chamber is measured as another influencing variable.

16. The method according to claim 12, wherein the pulse energy (E) is measured at the target object location as another influencing variable.

* * * * *